United States Patent
Lynes et al.

(10) Patent No.: US 10,763,144 B2
(45) Date of Patent: Sep. 1, 2020

(54) ADAPTABLE-MODULAR OPTICAL SENSOR BASED PROCESS CONTROL SYSTEM, AND METHOD OF OPERATION THEREOF

(71) Applicant: Verity Instruments, Inc., Carrollton, TX (US)

(72) Inventors: Sean Lynes, Carrollton, TX (US); Richard J. Daignault, Jr., Carrollton, TX (US); Zhiyong Gu, Carrollton, TX (US); Hong Chen, Carrollton, TX (US)

(73) Assignee: Verity Instruments, Inc., Carrollton, TX (US)

( * ) Notice: Subject to any disclaimer, the term of this patent is extended or adjusted under 35 U.S.C. 154(b) by 9 days.

(21) Appl. No.: 15/909,265

(22) Filed: Mar. 1, 2018

(65) Prior Publication Data
US 2019/0273007 A1    Sep. 5, 2019

(51) Int. Cl.
*H01L 21/67* (2006.01)
*H01L 21/66* (2006.01)
*G05B 19/00* (2006.01)

(52) U.S. Cl.
CPC ........ *H01L 21/67253* (2013.01); *G05B 19/00* (2013.01); *H01L 22/26* (2013.01); *H01L 22/12* (2013.01)

(58) Field of Classification Search
CPC .................. H01L 21/67253; H01L 22/26
See application file for complete search history.

(56) References Cited

U.S. PATENT DOCUMENTS

| 6,275,740 | B1 * | 8/2001 | Smith, Jr. | G01J 3/28 700/108 |
| 6,415,193 | B1 * | 7/2002 | Betawar | G05B 19/41865 700/121 |
| 6,499,114 | B1 * | 12/2002 | Almstead | G05B 19/4184 714/25 |
| 6,710,872 | B1 * | 3/2004 | Nakamura | G01J 3/28 345/440 |
| 6,882,416 | B1 * | 4/2005 | Hunter | G01N 21/8851 356/237.4 |
| 7,069,186 | B2 * | 6/2006 | Jung | G01J 1/0411 356/402 |
| 7,296,103 | B1 | 11/2007 | Purdy et al. | |

(Continued)

FOREIGN PATENT DOCUMENTS

| JP | 2005217448 A | 8/2005 |
| JP | 2013044537 A | 3/2013 |

(Continued)

*Primary Examiner* — Rocio Del Mar Perez-Velez
*Assistant Examiner* — Olvin Lopez Alvarez

(57) ABSTRACT

A method of operating a process control system and a process control system are provided by the disclosure. In one embodiment, the process control system includes: (1) an optical sensor configured to monitor a production process within a process chamber and generate optical data therefrom, (2) an operational controller configured to perform critical functions to determine processing conditions of the production process from the optical data, wherein the critical functions are directed by critical function controls, (3) an adaptable management controller configured to provide the critical function controls to the operational controller, wherein the adaptable management controller is hierarchically isolated from the operational controller during the critical functions.

23 Claims, 8 Drawing Sheets

(56) References Cited

U.S. PATENT DOCUMENTS

| | | | | |
|---|---|---|---|---|
| 7,623,978 B2* | 11/2009 | Lally | ...... | H01L 21/76807 438/16 |
| 8,125,633 B2* | 2/2012 | Whelan | ...... | G01J 3/28 356/300 |
| 8,539,567 B1* | 9/2013 | Logue | ...... | H04L 63/0884 726/7 |
| 8,543,700 B1* | 9/2013 | Randall | ...... | G06F 16/9574 709/226 |
| 8,583,597 B2* | 11/2013 | Atamna | ...... | G05B 19/4183 707/634 |
| 8,781,547 B2* | 7/2014 | Kuhn | ...... | A61B 5/1495 600/323 |
| 8,856,176 B1* | 10/2014 | Venu | ...... | G06F 16/11 707/783 |
| 10,295,993 B2* | 5/2019 | Choi | ...... | G05B 13/04 |
| 2002/0055259 A1 | 5/2002 | Balasubramhanya et al. | | |
| 2003/0029720 A1* | 2/2003 | Smith, Jr. | ...... | G01J 3/28 204/298.01 |
| 2003/0088555 A1* | 5/2003 | Watanabe | ...... | H04N 1/00127 |
| 2004/0138773 A1* | 7/2004 | Tomoyasu | ...... | G05B 19/41875 700/108 |
| 2004/0176864 A1* | 9/2004 | Cocco | ...... | G05B 19/4183 700/108 |
| 2004/0233429 A1* | 11/2004 | Taylor | ...... | G01J 3/02 356/319 |
| 2005/0222781 A1 | 10/2005 | Yue et al. | | |
| 2006/0010154 A1* | 1/2006 | Prahlad | ...... | G06F 3/0649 |
| 2006/0149403 A1* | 7/2006 | Shimizu | ...... | G05B 19/0426 700/96 |
| 2006/0279732 A1* | 12/2006 | Wang | ...... | G01J 3/02 356/326 |
| 2008/0003702 A1* | 1/2008 | Cruse | ...... | H01L 21/67069 438/7 |
| 2008/0081579 A1* | 4/2008 | Chen | ...... | H04W 4/00 455/187.1 |
| 2008/0125877 A1* | 5/2008 | Miller | ...... | G05B 15/02 700/29 |
| 2010/0145917 A1* | 6/2010 | Bone | ...... | G06F 16/122 707/694 |
| 2011/0230980 A1* | 9/2011 | Hammack | ...... | G05B 19/409 700/17 |
| 2011/0282866 A1* | 11/2011 | Erickson | ...... | G06F 16/24568 707/722 |
| 2012/0063354 A1* | 3/2012 | Vanga | ...... | H04L 41/0816 370/254 |
| 2013/0018501 A1* | 1/2013 | Okuno | ...... | H01L 21/67253 700/112 |
| 2014/0131578 A1* | 5/2014 | Hruska | ...... | G01N 21/359 250/339.02 |
| 2014/0184223 A1* | 7/2014 | Otvos | ...... | G01R 33/465 324/318 |
| 2016/0004734 A1* | 1/2016 | Naryzhny | ...... | G06F 16/22 707/722 |
| 2016/0061661 A1* | 3/2016 | Nishimura | ...... | G01J 3/2823 356/456 |
| 2016/0072270 A1* | 3/2016 | Rostron | ...... | H02H 3/081 700/294 |
| 2016/0086785 A1* | 3/2016 | Chiu | ...... | H01J 49/0445 250/282 |
| 2017/0017722 A1* | 1/2017 | Henderson | ...... | G06F 16/9535 |
| 2017/0102321 A1* | 4/2017 | Mizuguchi | ...... | G01N 21/27 |
| 2017/0314992 A1* | 11/2017 | Hargreaves | ...... | G01J 3/0291 |
| 2018/0074749 A1* | 3/2018 | Kabakura | ...... | G06F 3/0617 |
| 2018/0136118 A1* | 5/2018 | Kueny | ...... | G01N 21/73 |
| 2018/0357873 A1* | 12/2018 | Rischar | ...... | G08B 19/00 |
| 2019/0120690 A1* | 4/2019 | Zushi | ...... | G01J 3/42 |

FOREIGN PATENT DOCUMENTS

| | | | | |
|---|---|---|---|---|
| JP | 2015032796 A | | 2/2015 | |
| TW | 201520536 A | * | 6/2015 | ............ G01N 21/84 |
| TW | I591834 B | | 1/2017 | |
| TW | I593094 B | | 7/2017 | |
| TW | I606596 B | | 11/2017 | |

* cited by examiner

ADAPTABLE-MODULAR OPTICAL SENSOR BASED PROCESS CONTROL SYSTEM, AND METHOD OF OPERATION THEREOF

TECHNICAL FIELD

This disclosure relates generally to semiconductor processing systems. More particularly, the disclosure relates to the control and protection of semiconductor processes occurring on the semiconductor processing systems.

BACKGROUND

Selectively removing or depositing materials on a semiconductor wafer to form integrated circuit structures from wafers is well known in the art of semiconductor processing. Removal of material from a semiconductor wafer is typically accomplished by employing some type of etching process, such as, reactive ion etching or atomic layer etching. Depositing material on a wafer may involve processes such as chemical and physical vapor deposition (CVD/PVD), molecular beam epitaxy (MBE) or atomic layer deposition (ALD). In semiconductor processing, other plasma-based or emitting processes such as implantation are also known and optically monitored. All such processes are tightly controlled and are performed in environmentally controlled process chambers. Because exact amounts of material are to be deposited onto or removed from the surface of a wafer, the deposition or removal progress must be continually and accurately monitored to detect the precise state of a particular process and when the process should be further controlled or modified. A common control result is to stop a process. This result and its associated time is called the endpoint. Various sensors, such as optical sensors, are used to monitor semiconductor processes.

Optically monitoring processes within a chamber is commonly used for determining the processing status, processing state conditions, or endpoint, for an ongoing process. Monitored processes include semiconductor etching, deposition, implantation and other processes where film thickness and plasma/wafer emission monitoring is applicable. Additionally, chamber conditions independent of or combined with the wafer conditions, may be monitored. Depending on the process, various algorithms may be employed for deriving parameters from the optical signal intensities, typically related to chemical species signatures that are useful in assessing the state of the semiconductor process and the processed wafer, detecting faults associated with the process, chamber or other equipment and even the condition of interior surfaces of the plasma chamber.

SUMMARY

In one aspect, a process control system is provided. In one embodiment, the process control system includes: (1) an optical sensor configured to monitor a production process within a process chamber and generate optical data therefrom, (2) an operational controller configured to perform critical functions to determine processing conditions of the production process from the optical data, wherein the critical functions are directed by critical function controls, (3) an adaptable management controller configured to provide the critical function controls to the operational controller, wherein the adaptable management controller is hierarchically isolated from the operational controller during the critical functions.

In another aspect, a method of operating a process control system is disclosed. In one embodiment, the method includes: (1) providing, from an adaptable management controller, critical function controls for an operational controller, (2) autonomously performing, by the operational controller, critical functions employing the critical function controls, and (3) hierarchically isolating the adaptable management controller from the operational controller during the critical functions.

BRIEF DESCRIPTION OF THE DRAWINGS

The disclosure may be understood by reference to the following detailed description taken in conjunction with the drawings briefly described below.

DETAILED DESCRIPTION

Figure 1:
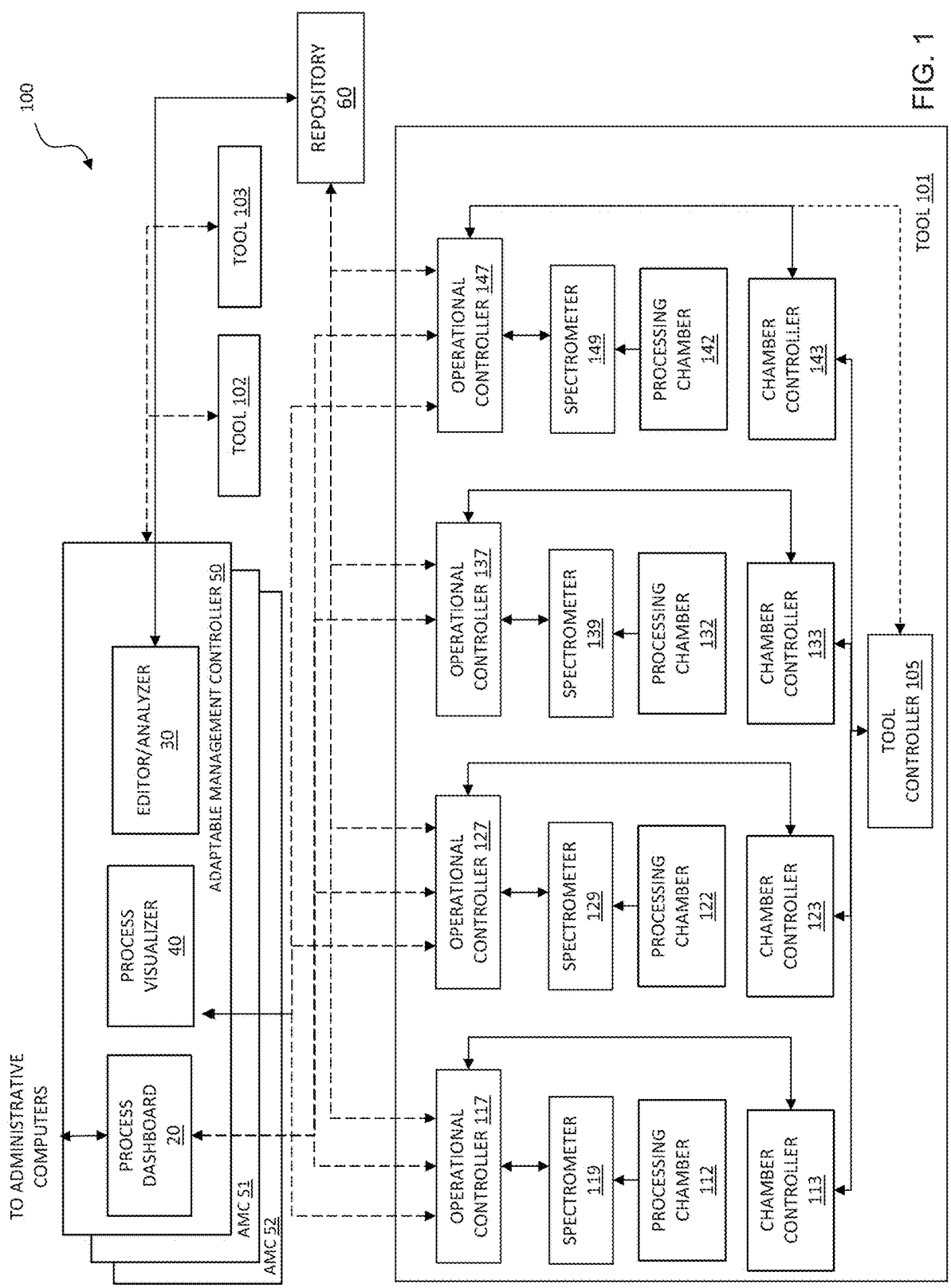
FIG. 1 illustrates a block diagram of an example of a process control system, an adaptable-modular process control system (AMPCS), constructed according to the principles of the disclosure.

A spectrometer is an example of an optical sensor that is used in semiconductor processing systems for optical monitoring. A spectrometer often works with an endpoint controller and a chamber controller to perform the chemical species signature analysis and direct the semiconductor processes within a process chamber. In addition to being connected to chamber controllers for controlling processing chambers, endpoint controllers are usually accessible from other computing devices, such as a tool controller, Fab controller, a management controller, etc., to obtain reporting data (e.g., uptime, faults, process statistics) from the endpoint controller.

The disclosure realizes that this common configuration of semiconductor processing systems adds vulnerability to the semiconductor processes by allowing access to the endpoint controller from external computing devices that can occupy processing bandwidth of the endpoint controller during critical functions of semiconductor processes. This reduction in computing processing power can negatively affect semiconductor processes and result in the ruin of costly semiconductor wafers.

Further details of common processing control systems may be summarized as follows. Existing system architectures are typically not scalable for network environments and most system components are tightly coupled in ways that require them to be compiled in the same application and also have direct interactions that made separation across multiple programs, computers, and networks effectively impossible. Interactions and communication between internal components of existing systems are often arbitrary and direct access between internal elements of these components is often neither thread safe or efficient. The existing system architecture is identified as having very limited, if any, isolation, separation, and networking possibilities. Existing systems may have all interfaces and all calculation components tightly coupled so distributing key interfaces or processing across multiple computers is severely limited.

Real-time performance is also hampered by synchronous notifications to and updates of the user interface (UI), as well as the graphical user interface (GUI) regularly locking out processing while processing data and details were directly accessed to update the UI. Furthermore, in existing systems users may easily affect performance. Direct access to the processing application, OS, and files of existing systems presents an uncontrollable risk to the performance of all real-time processing such that critical interruptions and latency can easily be introduced by even normal interactions with existing systems.

The disclosure provides a process control system for semiconductor processes that is both adaptable and modular. The disclosed process control system advantageously separates critical functions for determining processing conditions in processing chambers from asynchronous operations of the process control system. As such, the process control system employs operational controllers that are hierarchically isolated from other components of the process control system. Accordingly, the operational controllers are autonomous and isolated during critical functions. The control system, however, advantageously allows accessibility to the operation controllers during set-up for monitoring semiconductor processes. This allows simultaneous distribution of critical function controls that include operating parameters, local and global settings, and scripts, to multiple operational controllers from a single distributing device, such as an adaptable management controller via a repository. The critical function controls as used herein include configuration files for directing the critical functions of the operational controllers. The configuration files can include variables, equations, and sequences (or scripts) that provide process inputs and definitions. The critical function controls can also include material files, reference files, persistent variable files, and settings. The settings can include global settings and controller settings that are unique for a particular controller.

An operational controller as used herein is a computing device configured to monitor semiconductor processes in a semiconductor processing chamber. The operational controller receives optical feedback from a sensor or sensor system, such as a spectrometer or another optical sensor that is used to control the exact amounts of material that are to be deposited onto or removed from the surface of a wafer. Thus, an operational controller can include the functionality of an endpoint controller. In some embodiments, an operational controller, or the functionality thereof, can be integrated in one or multiple computing devices of a process control system. For example, the functionality of an operational controller can be included in an autonomous spectrograph. An autonomous spectrograph is an example of a self-contained sensor system that includes a spectrometer and an operational controller. In some embodiments, an operational controller can be employed with devices of a processing system, such as with a chamber controller, to direct the operation of a processing chamber. Regardless the implementation, the disclosure provides a process control system with an operational controller that is hierarchically isolated while performing critical functions.

In contrast to conventional systems, the hierarchical isolation disclosed herein protects the critical functions from external influence but yet allows safe and simultaneous distribution of critical function controls to operational controllers. Hierarchical isolation includes controlling access to the operational controller employing permission levels wherein personnel, and other non-critical influences, more removed from the semiconductor processes, such as management and environmental evaluation systems, are more restricted and personnel more closely involved, such as tool engineers, are allowed more access. Hierarchically isolating the operational controller allows the ability to remove a common point of failure from a single device, such as the endpoint controller, as used in conventional processing system architectures. In some embodiments, hierarchical isolation only allows access to an operational controller when the computer processing of the operational controller is idle with respect to critical functions.

A critical function as used herein is an operation that occurs in real time or near real time for monitoring the production of a semiconductor product; a real time function that typically occurs in the realm of milliseconds. A critical function can employ algorithms for deriving parameters from optical data, such as optical signal intensities, that are useful in assessing the state of a production process. The production process can be a semiconductor process or another process used to develop products, such as a wafer, within a plasma chamber. Critical functions as used herein include, at least: tool control and process results messages, chemical species signature analysis, and autonomous decision making. An asynchronous operation as used herein does not need to occur in real time but can occur when computing processing power is available from, for example, an operational controller, without affecting critical function processing.

The disclosed process control system provides a modularized architecture that is distributed across a communication network, such as a local or wide-area network. The disclosed control system compresses needed processing space for endpoint processing (spectral sensor), increases reliability from administrative perspective, and off-loads user interface to administrative computing devices to make chamber real-time processing more efficient but still accessible. The process control system further removes the human element by allowing automated administrative steps. This safely allows remote administration and provides ease of data gathering and analysis.

FIG. 1 illustrates a block diagram of an example of a process control system, an adaptable-modular process control system (AMPCS) 100, constructed according to the principles of the disclosure. FIG. 1 illustrates an environment where the AMPCS 100 or an adaptable-modular process control method (AMPCM), as disclosed herein, can be employed to provide autonomous data collection, data processing, and control of production processing, which is more specifically semiconductor processing in FIG. 1. The AMPCS 100 includes multiple adaptable management controllers a repository 60, multiple operational controllers, and multiple spectrometers. The number of adaptable management controllers and/or the configuration or available functionalities thereof can vary in different embodiments. For example, some adaptable management controllers may not include a process dashboard, a process visualizer, and an editor/analyzer but instead include only one or two of these. Thus, the configuration and functionality of the different adaptable management controllers can vary. In some embodiments a single adaptable management controller can by employed. In FIG. 1, three adaptable management controllers 50, 51, 52, are illustrated. Adaptable management controller 50 is discussed in detail below as a representative of the other adaptable management controllers 51, 52. In some embodiments, the adaptable management controllers 51, 52, can be implemented on some of the administrative computing devices and provide direct access instead of using the adaptable management controller 50.

The various devices or components of the AMPCS 100 can be communicatively coupled together via various connections. Conventional connections can be used for the communicative coupling between components of the AMPCS 100. A communication network, such as Ethernet, can be used for some of the communicative coupling. For some remote devices, a communication network such as the Internet can be used. Some of the connections in FIG. 1 are illustrated by dashed lines to indicate the connections can be temporary connections or non-permanent connections that provide hierarchical isolation during different operations of the AMPCS 100. For example, when performing critical functions, the connections represented by dashed lines can be physically removed or internally disconnected, such as via coding, to provide isolation. The dashed connection lines in FIGS. 2 and 3 also indicate connections that can provide hierarchical isolation.

The AMPCS 100 is shown as part of a fabrication system having multiple tools, tools 101, 102, and 103, with multiple plasma processing chambers, chamber controllers, and sensing systems. Four processing chambers are shown for tool 101 but a different number may be used. The tools 101, 102, 103 can be part of a processing line of a FAB. The FAB can have more or fewer tools than the representative tools 101, 102, and 103. Other FABs can also be similarly coupled to the adaptable management controller 50. Administrative computing devices, such as a management controller for the FAB, can be communicatively coupled to the adaptable management controller 50, to obtain reports, such as dashboard reports, from the FAB and tools. Data for the reports can be obtained from the repository 60 via the adaptable management controller 50. Tool 101 is illustrated and discussed in detail below with respect to the adaptable management controller 50 as a representative of the other tools 102, 103.

The tool 101 includes multiple processing chambers 112, 122, 132, 142, that are configured to process wafers to form integrated circuits. The tool 101 also includes multiple chamber controllers 113, 123, 133, 143, and a tool controller 105 that directs the operation of the processing chambers 112, 122, 132, 142, via each of the processing chambers corresponding chamber controllers 113, 123, 133, 143. Optically coupled to the processing chambers 112, 122, 132, 142, are spectrometers 119, 129, 139, 149, that are used to monitor the processing in the processing chambers. Instead of a spectrometer, other optical detectors can be used, such as a monochromator or photodiode-based detector. Other sensing systems, such as for pressure, RF energy, gas flow, temperature, chuck position, and platen position, can also be used to monitor the processing in addition to optical detectors.

Using optical detectors as an example, during normal semiconductor processing an Optical Emissions Spectroscopy (OES) system and/or an interferometric endpoint (IEP) system can be employed to monitor and/or control the state of a plasma process within each of the processing chambers. The processing chambers 112, 122, 132, 142, generally enclose a wafer and process plasma in a partially evacuated volume which may include various process gases. Light, visible and invisible, is produced from the plasma created in the chamber. Characteristics of the plasma light are influenced by the relationships of gasses used, the level of energy used to create the plasma and the materials within the chamber, most significant being the semiconductor material being processed. Concurrent with plasma light emissions, can be the introduction of light from an external source (not shown). For IEP processing, this external light would be produced by a continuous source or strobing flashlamp controlled by the spectrometers 119, 129, 139, 149. Plasma generated light is monitored by the spectrometers 119, 129, 139, 149, through a viewport, typically on the side of the chamber, and flashlamp light is typically monitored through a series of optics on the top of the chamber since reflection measurement is the primary objective. Regardless of the monitoring location, light is guided via optical coupling systems to an optical detector, such as the spectrometers 119, 129, 139, 149, of FIG. 1. Detected light may range over the wavelength range from Deep Ultraviolet (DUV) to Near-infrared (NIR) (typically less than 200 nm to greater than 1700 nm) and wavelengths of interest may be selected from any subrange therein. The viewports are commonly formed from sapphire or quartz materials supporting a wide range of wavelength transmission. Optical coupling systems can be used to optically couple the corresponding processing chambers to their respective spectrometers and may include multiple types of optical elements such as, but not limited to, optical filters, lenses, mirrors, windows, apertures, fiber optics, etc.

For post detection and conversion to electrical signals, optical signals are typically amplified, digitized within a subsystem of the optical detector and passed to a signal processor. Operational controllers as disclosed herein can be the computing device that performs the signal processing and determines processing conditions. The operational controller can be an industrial PC, PLC or other computing device which employs one of more algorithms to perform critical functions to produce output, such as, an analog or digital control value representing the intensity of a specific wavelength or the ratio of two wavelength bands. The algorithm(s) can analyze emission intensity signals at predetermined wavelengths and determine trend parameters that relate to the state of the process and can be used to access that state, for instance endpoint detection, etch depth, plasma conditions, etc. The output values may be transferred to the processing chambers for monitoring and/or modifying the production process occurring within the processing chambers.

Operational controllers 117, 127, 137, 147, are configured to receive emissions from their coupled spectrometers 119, 129, 139, 149, perform analysis for detection of endpoint, and provide real-time feedback (process states, sub-endpoints, and any other monitored details) to the corresponding chamber controllers 113, 123, 133, 143, based thereon. As noted above, the operational controllers 117, 127, 137, 147, can be configured to perform the functions typically performed by endpoint controllers and signal processors. The spectrometers 119, 129, 139, 149, are coupled to their respective operational controllers 117, 127, 137, 147, via conventional communication connections such as USB, RS232, and/or Ethernet. The operational controllers 117, 127, 137, 147, are coupled to their respective chamber controller 113, 123, 133, 143, via conventional connections such as DI/O, RS232, and Ethernet. In some embodiments, more than one of the operational controllers 117, 127, 137, 147, may be integrated into a single computing device. All of the operational controllers 117, 127, 137, 147, can be integrated into a single computing device if processing needs are low enough to support this configuration with the real-time accuracy desired.

In addition to being coupled to their respective spectrometers 119, 129, 139 and 149, the operational controllers 117, 127, 137, 147, are communicatively coupled to the adaptable management controller 50 and the repository 60. Coupling to the adaptable management controller 50 and repository 60 are optional and not required for reliable monitoring, endpoint detection, and/or other signal processing performance in real-time. The adaptable management controller 50 is a computing device that provides a programmatic way to add, remove, and edit settings, files, and other critical function controls for the operational controllers 117, 127, 137, 147, to monitor semiconductor processes in the processing chambers 112, 122, 132, 142. The critical function controls can be available simultaneously to the operational controllers 117, 127, 137, 147, and as the communications connection and system state allows, these will be safely integrated into each of the operational controllers 117, 127, 137, 147. In some embodiments, a user can manually manage critical function controls without employing the adaptable management controller 50. Additionally, each of the operational controllers 117, 127, 137, 147, can sync with the manual changes on the repository 60.

The adaptable management controller 50 is hierarchically isolated from the operational controllers 117, 127, 137, 147, during the critical functions. The hierarchical isolation protects the critical functions from interruptions by the adaptable management controller 50 that can damage wafers being processed. For example, instead of processing a request for data from the adaptable management controller 50 during a critical function, the operational controllers 117, 127, 137, 147, can process the request when computing processing power is not directed to critical functions.

The adaptable management controller 50 also provides an interface to the repository 60 to allow the retrieval of data deposited in the repository 60 from other components of the AMPCS 100. The repository 60 is a system archive configured to (optionally) store system data for the AMPCS 100, including system data regarding the semiconductor processes. The repository 60 can be conventional memory, external storage, or network storage that receives and stores data. The data can be operational data resulting from the critical functions. The operational data can include data files and log files generated by the critical functions. If network storage, the repository can be communicatively coupled to various computing devices of the AMPCS 100 via settings defined by the adaptable management controller 50 to allow access to data stored thereon and allow the delivery of data to store on the repository 60. In addition to the system data, the repository 60 can also store critical control functions, such as setup data, that can be retrieved by the adaptable management controller 50 and employed for operational controllers of other tools, such as tool 102 and tool 103. The repository 60 can be located remotely or completely disconnected from the other components of the AMPCS 100, without adverse effect to critical functions.

The operational data can be automatically sent to the repository 60 from various components of the AMPCS 100. Advantageously, the operational controllers 117, 127, 137, 147, can send the operational data during idle computer processing time. The adaptable management controller 50 can receive requests for the operational data from administrative computing devices coupled thereto. The administrative computing devices can include a FAB management controller. In some embodiments, the administrative computing devices can access the repository without employing the adaptable management controller 50. Summary details of the semiconductor process or of the operational data can be presented to administrative computing devices in a dashboard format via the adaptable management controller 50. The adaptable management controller 50 can be employed as an administrative computing device. The adaptable management controller 50 in FIG. 1 is for a tool line. In other embodiments, adaptable management controllers as disclosed herein can be used for a single tool.

The adaptable management controller 50 is configured to provide critical function controls to the operational controllers 117, 127, 137, 147. In some embodiments, the critical function controls can be provided to the repository 60 and then accessed by the operational controllers 117, 127, 137, 147. The adaptable management controller 50 is a computing device having a processor and a memory, and is hierarchically isolated from the operational controllers 117, 127, 137, 147 during the critical functions. The adaptable management controller 50 includes a process dashboard 20, a process visualizer 40, and an editor/analyzer 30. The process dashboard 20, the process visualizer 40, and the editor/analyzer 30 can each be implemented as series of operating instructions on a single computing device that direct the operation of a processor or processors thereof. In some embodiments, the process dashboard 20, the process visualizer 40, and the editor/analyzer can each be implemented on different computing devices. Additional embodiments of the adaptable management controller 50 which contain all process visualizer functions as well as critical functions allowing virtualization of a complete adaptable management controller 50 for off-line editing of sequences (scripts) and post-collection data analysis. The adaptable management controller 50 can include additional components such as disclosed with the adaptable management controller in FIG. 3.

The process dashboard 20 monitors the health and administration of the tools 101, 102, 103, and the processing chambers of the tools 101, 102, 103. The process visualizer 40 is configured to safely obtain information and data from the operational controllers 117, 127, 137, 147. The editor/analyzer 30 manages configuration files for the operational controllers 117, 127, 137, 147.

The operational controllers 117, 127, 137, 147, receive optical data, such as from the spectrometers 119, 129, 139, 149, and direct operation of the coupled processing chambers based on the optical data. As noted above, the operational controllers 117, 127, 137, 147, can direct operations via the corresponding chamber controllers coupled to the processing chambers. The direction or feedback to the chamber controllers can be a processing chamber adjustment based on a characterization intensity ratio determined by, for example, the operational controllers, the spectrometers, or a combination of any of these devices.

Figure 2:
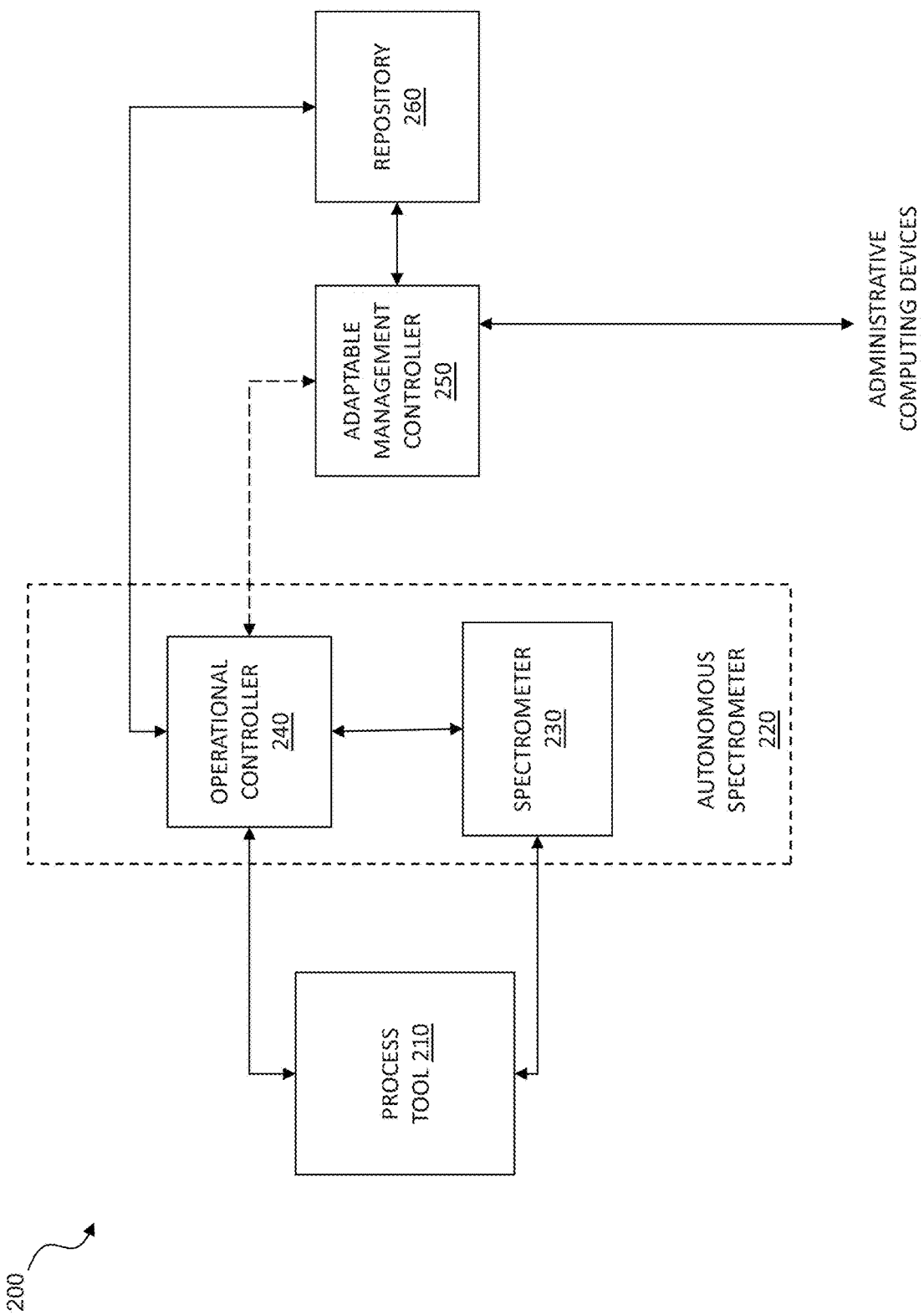
FIG. 2 illustrates a block diagram of another example of some elements in an AMPCS constructed according to the principles of the disclosure.

FIG. 2 illustrates a block diagram of another example of select elements in an adaptable-modular process control system (AMPCS) 200 constructed according to the principles of the disclosure. The AMPCS 200 is shown coupled to a process tool 210 and includes an autonomous spectrometer 220, an adaptable management controller 250, and a repository 260. The components of the AMPCS 200 can be communicatively coupled via conventional connections.

As used hereinafter, the term "spectrometer" should be understood as generally comprising at least a spectrographic component for dispersing light into a spectrum, an optical detector for converting spectral light from the spectrographic component to raw (uncalibrated) spectral intensity data and computational electronics, firmware and processing capacity for executing software performing measurements, calibrating the measurements and converting the raw spectral intensity data into optical signal data. Thus, a typical spectrometer will include at least one optical port, optical coupler or other optical component for receiving light, and one or more data connections, ports or other data transmission component for sending and receiving data and executable program code. An autonomous spectrometer as used herein includes the components of a spectrometer as described above and an operational controller. Thus, an autonomous spectrometer is a single computing device having integrated therein an operational controller and a spectrometer.

The process tool 210 is configured to process wafers to form integrated circuits. The process tool 210 includes at least one environmentally controlled processing chamber, such as one of the processing chambers 112, 122, 132, 142, of FIG. 1. The process tool 210 can also include at least one chamber controller coupled to the processing chamber. Additional process tools can be coupled to the autonomous spectrometer 220.

The autonomous spectrometer 220 is a single computing device that includes both a spectrometer 230 and an operational controller 240. The spectrometer 230 and the operational controller 240 can include the necessary logic to perform the same functionality as the spectrometers 119, 129, 139, 149, and the operational controllers 117, 127, 137, 147, as described above with respect to FIG. 1. The adaptable management controller 250 and the repository 260 can also include the necessary logic to perform the same functionality as the adaptable management controller 50 and the repository 60 as described above with respect to FIG. 1.

The adaptable management controller 250 is connected to administrative computing devices, just as in FIG. 1. Via the connection, the adaptable management controller 250 receives data requests and responds with data, such as operational data to the administrative computing devices. The adaptable management controller 250 can retrieve the operational data from the repository 260. The spectrometer 230 and the operational controller 240 can automatically and asynchronously send the operational data to the repository 260 for storage. The adaptable management controller 250 can also receive critical function controls from the administrative computing devices for distribution to the operational controller 240. In some embodiments, the critical function controls can be stored in the repository 260. The adaptable management controller 250 is hierarchically isolated from the autonomous spectrometer 220.

Figure 3:
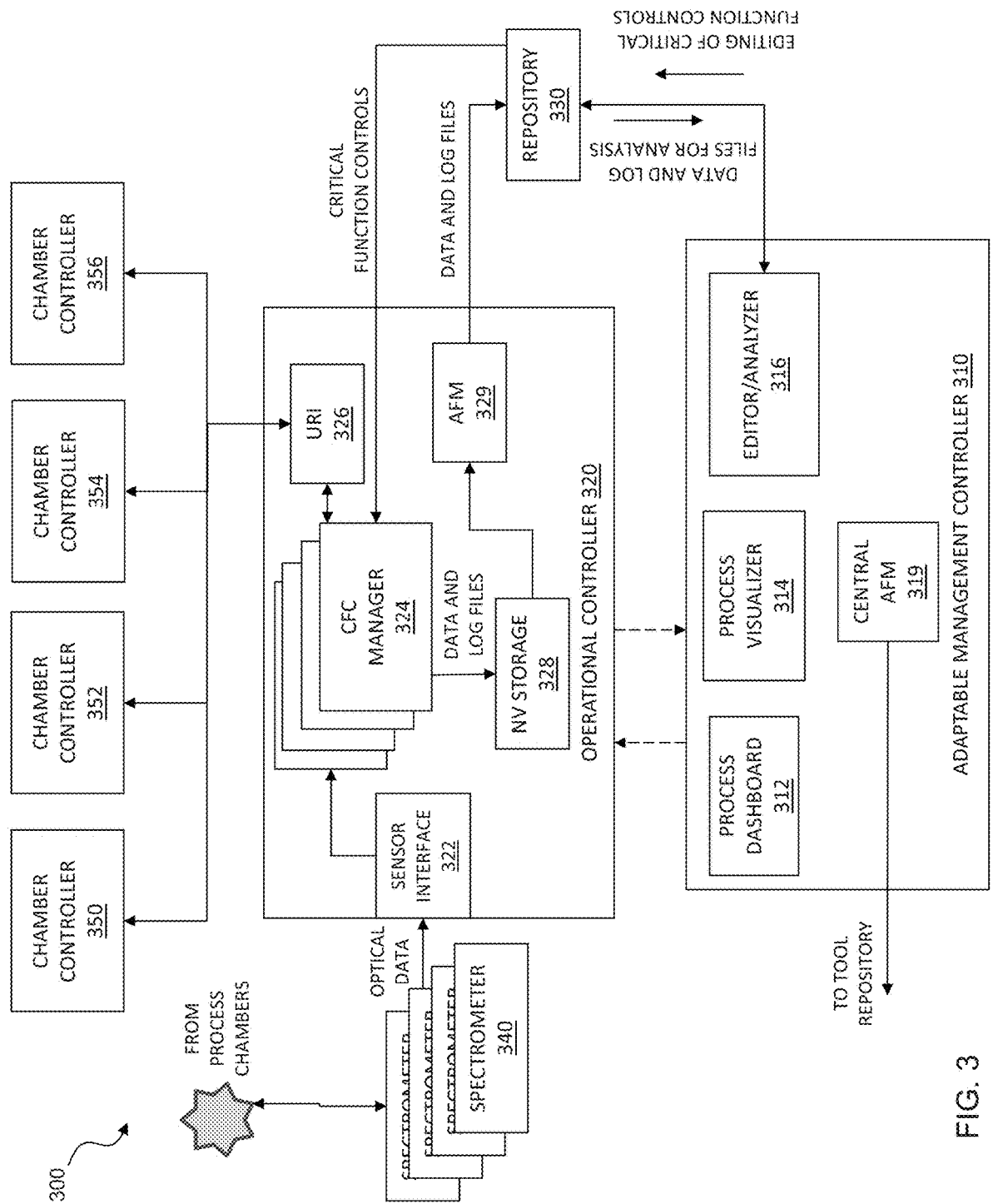
FIG. 3 illustrates a block diagram of yet another example of an AMPCS constructed according to the principles of the disclosure.
Figure 4:
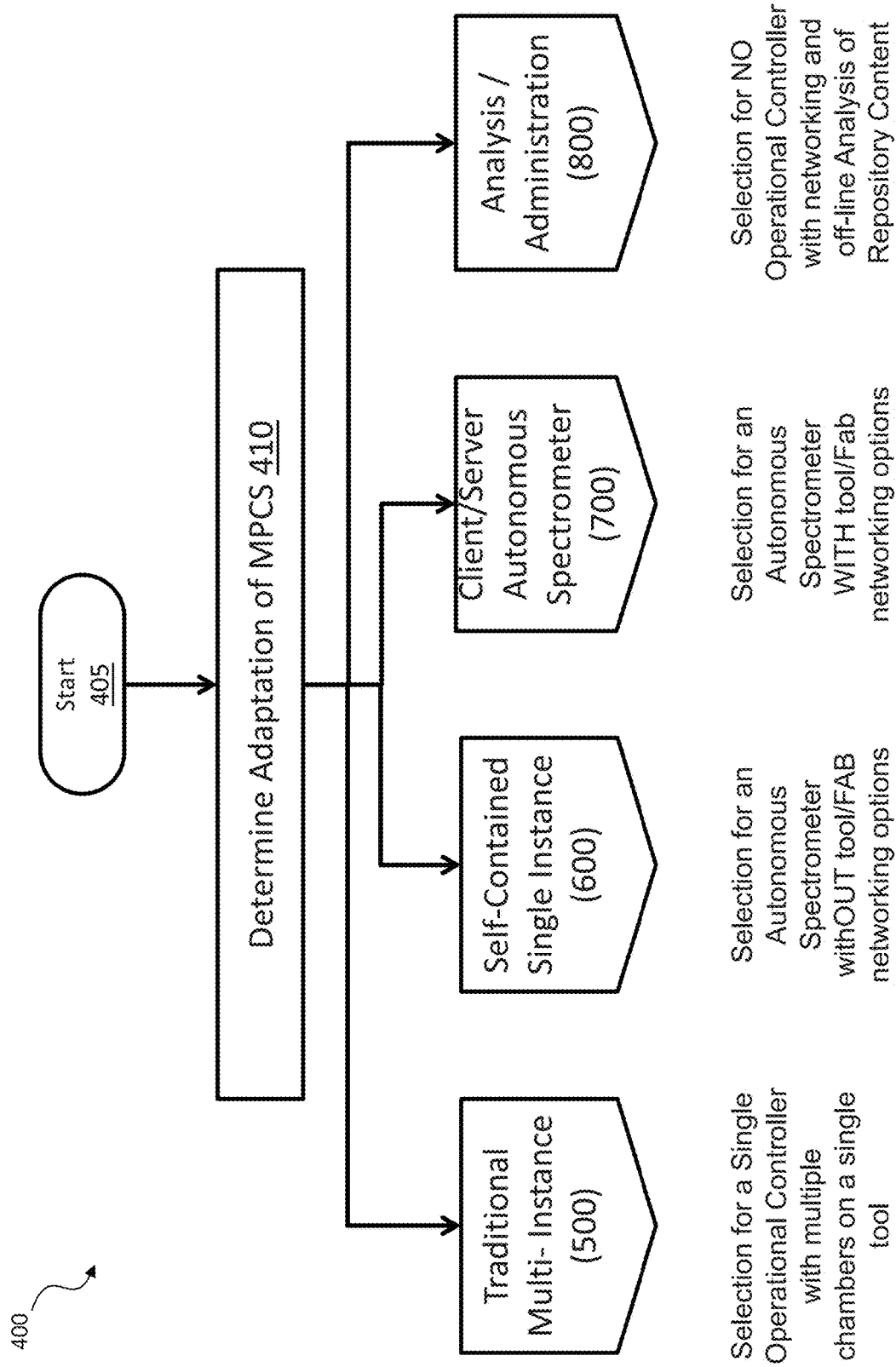
FIG. 4 illustrates a flow diagram of an embodiment of a method of operating a process control system carried out according to the principles of the disclosure.

FIG. 3 illustrates a block diagram of yet another example of an adaptable-modular process control system (AMPCS) 300 constructed according to the principles of the disclosure. The AMPCS 300 includes an adaptable management controller 310, an operational controller 320, a repository 330, and spectrometers 340. The AMPCS 300 is coupled to multiple chamber controllers 350, 352, 354, 356. Each of the chamber controllers can be coupled to a processing chamber (not shown in FIG. 3).

The adaptable management controller 310 provides setup, real-time monitoring, and controls to the operational controller 320. The adaptable management controller 310 includes a process dashboard 312, a process visualizer 314, an editor/analyzer 316, and a central automated file manager (AFM) 319. The process dashboard 312 monitors the health and administration of tools and chambers connected to the AMPCS 300. In some embodiments, the process dashboard 312 is defined to monitor the tools and chambers as a single combined entity. The adaptable management controller 310 can be implemented on a single computing device. In other embodiments, the adaptable management controller can be implemented on multiple computing devices. For example, the process dashboard 312 can be on a first computing device, and the process visualizer 314 can be on a different second computing device. The editor/analyzer 316 and central AFM 319 can be one the first or second computing devices or even implemented on different computing devices.

The process visualizer 314 is configured to safely obtain information and real time data, including real time status and logs, from the operational controller 320. The obtained information and real time data can be visually displayed, such as via a graph, by the process visualizer 314. The information and data can be live data. Live data is on-demand data that can be shown while processing and monitoring are occurring simultaneously creating the data file. The data in a data file cannot be accessed at all locally or remotely until it is complete. Live data, however, is what is actively going into the data file being created. Live data may or may not be delayed, but live data's significance is that it is intended for only human use and is not critical to, or involved with real-time process functions. The process visualizer 314 can be used to collect data manually from the operational controller 320. Thus, the process visualizer 314 allows a user having an approved permission level to manually access operational data in addition to the automated delivery and retrieval of the operational data provided by the AMPCS 300. In various embodiments, manual copying of the data is not excluded if the automated feature is disabled or if data is to be moved to an additional location.

The editor/analyzer 316 is used to edit or post-process off-line, critical function controls for the operational controller 320 as well as analyze the data and logs. The editor/analyzer 316 provides the ability for personnel, such as an administrator, having a proper permission level to load or edit at least some of the critical function controls. The critical function controls can also be received by the adaptable management controller 310 from administrative computing devices that distribute the critical function controls via the repository 330. The editor/analyzer 316 can store the critical function controls in the repository 330 for synchronization by each operational controller sharing that same repository, such as operational controller 320 and repository 330, when system processing is idle and a connection to the repository is available. Advantageously, the operation controller 320 can pull the critical function controls from the repository 330.

The editor/analyzer 316 is also intended to review and analyze system logs and data in the repository 330. The analysis can include determining the occurrence of process events from the data files and log files. The data files or the log files can include markers that correspond to the process events.

The operational controller 320 includes a sensor interface 322, a critical function control manager (CFCM), (represented by CFCM 324), for each of the chamber controllers 350, 352, 354, 356, a universal remote interface (URI) 326, non-volatile storage 328, and an AFM 329. The sensor interface 322 supports multiple spectrographs, such as one from the spectrometers 340, operating in a variety of different environments. In FIG. 3, multiple spectrometers 340 are illustrated to correspond to the process chambers (not shown) of each of the chamber controllers 350, 352, 354, 356. The communication transport mechanism for the sensor interface 322 can be, for example, Ethernet (TCP/IP) or USB.

Each instance of the CFCM 324 employs configuration files (i.e., critical function controls) from the repository 330 for the operational controller 320. Each instance of the CFCM 324 also receives optical data from the sensor interface 322 from each of the spectrometers 340 and executes equations and scripts (i.e., perform critical functions) to search for any events occurring in the process chambers that the tool should be sent. The CFCM 324 also creates data files and a critical log file that details processing execution and delivers these files to the non-volatile storage 328. The URI 326 provides communication handling and interface mapping between one or more CFCM 324 instances on the operational controller 320 and the one or more process module/chamber controllers 350, 352, 354, 356. The URI 326 provides a universal communication interface that converts the communication language of the chamber controllers 350, 352, 354, 356, to the communication language or protocol employed by the CFCM 324. As such, the URI 326 advantageously allows the operational controller 320 and the CFCM 324 to be used with various types of chamber controllers that employ different network transport or protocols. This interface can utilize, for example, digital I/O, RS232 or Ethernet allowing adaptability to various protocols.

The non-volatile storage 328 stores data from the various components of the operational controller 320, including the data files and log files created by and received from the CFCM 324. The AFM 329 archives the data and log files from the non-volatile storage 328 to the repository 330. The AFM 329 ensures that files will be deleted or archived in a "balanced" manner so that no one instance would either retain or lose more files than another. The central AFM 319 of the adaptable manager controller 310 balances and manages the data and logs put there by the AFMs running on each operational controller, such as AFM 329 on operational controller 320. AFM 329 manages the non-volatile storage 328 based on the user set minimum "free space" rather than some amount of time to keep files. The AFM 329 can automatically move data from the non-volatile storage 328 to the repository 330. This data can then be safely accessed by the adaptable management controller 310. Additionally, this data can be further managed by the central AFM 319 to either further archive to a more centralized location or deleted as needed to maintain space for future archived files.

The chamber controllers 330, 332, 334, 336, are coupled to the operational controller 320 and the spectrometer. The chamber controllers 330, 332, 334, 336, receive processing directions to direct the operation of processing chambers coupled thereto (not illustrated in FIG. 3). The chamber controllers 330, 332, 334, 336, can be conventional chamber controllers.

FIG. 4 to FIG. 8 illustrate flow diagrams of embodiments of methods of operating a process control system carried out according to the principles of the disclosure. The process control systems are used to monitor semiconductor processes. The methods disclosed in FIG. 4 to FIG. 8 can be employed with modular process control systems (MPCS), such as the AMPCS 100, and demonstrate the multiple control system configurations that can be adapted. The method 400 begins in a step 405.

In a step 410, a determination of the type or adaptation of modular process control system is made. At least a portion of the determination can be made by a user or an administrator based on the equipment and communication connections available for the process control systems. An installation program or installer can also be run on a target platform and used to detect operating capabilities and provide valid options for the adaptation of the MPCS based thereon. The administrator can determine a particular adaptation based on the options provided by the installer. The process controls systems disclosed herein, therefore, can be adapted based on a desired configuration and equipment capability. In the method 400, a determination between four different adaptations of MPCS is made. Methods of operation are then employed according to the adaptation of the MPCS determined. When the MPCS includes a single operational controller with multiple processing chambers on a single tool, the method 400 proceeds to step 505 for the start of method 500 illustrated in FIG. 5. When the MPCS includes an autonomous spectrometer without tool or FAB networking options, the method 400 proceeds to step 605 for the start of method 600 illustrated in FIG. 6. When the MPCS includes an autonomous spectrometer that does have tool or FAB networking options, the method 400 proceeds to step 705 for the start of method 700 illustrated in FIG. 7. When the MPCS includes an operational controller without networking and off-line analysis of repository content, the method 400 proceeds to step 805 for the start of method 800 illustrated in FIG. 8. The method 400 then continues according to the noted methods 500, 600, 700, or 800.

Figure 5:
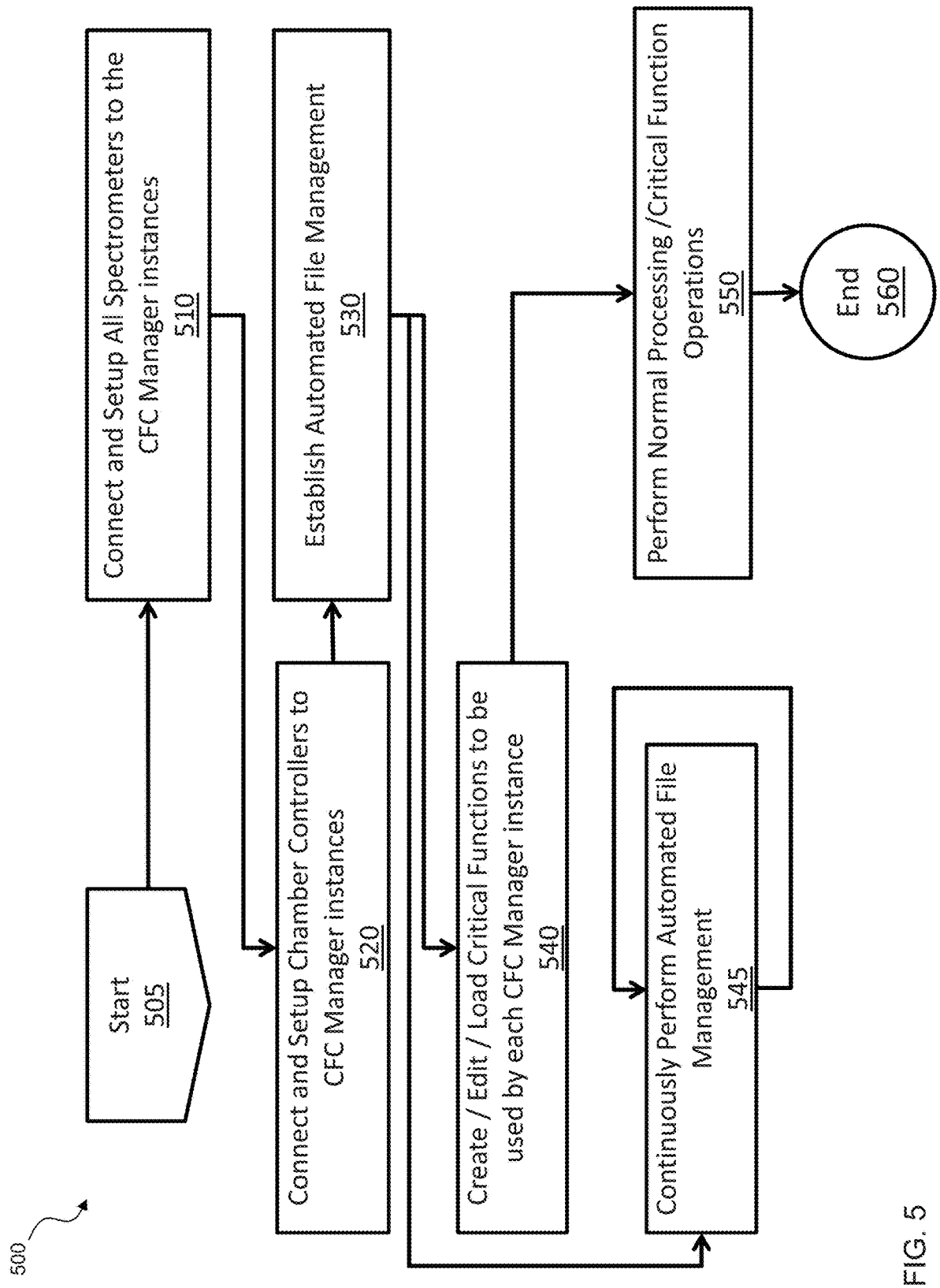
FIG. 5 illustrates a flow diagram of an embodiment of a method of operating a MPCS carried out according to the principles of the disclosure.

Turning now to FIG. 5, illustrated is an embodiment of a method 500 of operating a MPCS carried out according to the principles of the disclosure. For the method 500, the MPCS includes a single operational controller monitoring multiple processing chambers. Operational controller 320 of FIG. 3 provides an example. The method 500 begins in step 505.

In a step 510, one or multiple spectrometers of the MPCS are connected to and set-up with an instance of a CFCM on the operational controller. A single instance of a CFCM can be used for a single spectrometer to provide a unique coupling of spectrometers to CFCMs. The spectrometers can be connected to the CFCM instances via a sensor interface of the operational controller. A physical connection, such as a cable can be used to connect the spectrometers to the sensor interface. Setting-up can include defining IP addresses, mapping to communication channels, and configuring the hardware of the sensor interface to communicate with the spectrometers.

Each chamber controller of the MPCS is connected to and set-up with the CFCM instances in a step 520. A physical connection, such as a cable can be used to connect the chamber controllers to the operational controller and the CFCM instances. A conventional communications interface can be used for the physical connection. The chamber controllers can be set-up via a URI of the operational controller. The URI can be used to set-up the connections with the correct CFCM instance and can include defining IP addresses, mapping to communication channels, and configuring the hardware of the communications interface to communicate with the chamber controllers. The correct CFCM instance is the CFCM instance that is coupled to the corresponding spectrometer of the chamber controller.

In a step 530, automated file management is established for the process control system. Automated file management allows the automated and asynchronous movement of data files used or generated in the MPCS, such as critical functions controls and operational data, to dedicated locations of the MPCS. The automated file management can automatically manage the data and log files independent of the operation of the critical functions. An administrator can set-up the location and movement requirements of the files for automation. In one embodiment, automated file management includes configuring NV storage of the operational controller to receive data and log files from the CFCMs. Additionally, a repository can be connected to the operational controller to receive the data and log files. In some embodiments, the repository is already connected to the operational controller, such as via a cable, and the connection is confirmed. An AFM of the operational controller can be used to set-up the connection between the repository and the NV storage and activate automated file management.

After step 530, the method 500 continues to step 540 and step 545 in parallel but independent of the subsequent steps. In step 540, critical function controls are provided for the CFCM. The critical function controls can be loaded from the NV storage for use by the CFCM. In some embodiments, the stored critical function controls are edited before being provided to the CFCM. An administrator can employ a user interface, such as a keyboard, to edit the critical function controls. In other embodiments, critical function controls or new critical function controls can be created for the CFCMs. Again, a user interface can be employed to input the critical function controls. The critical function controls can be the same for each instance of the CFCM. In other embodiments, the critical function controls can differ for one or all of the CFCMs.

In step 545, automated file management is continually performed. The automated file management can include management of the NV storage and the repository. The automated file management can continue as long as the MPCS is operating.

Returning now to step 540, the method 500 continues to step 550 where monitoring of processes and critical function operations are performed. The monitoring of processes and the critical function operations can be performed via conventional procedures. In one embodiment, step 550 can include: enabling tool control for automated data collection, processing, and event reporting; wait for start of tool control; perform critical functions using critical function controls and store results in NV and continue until tool control is released. The method 500 then continues to step 560 and ends.

Figure 6:
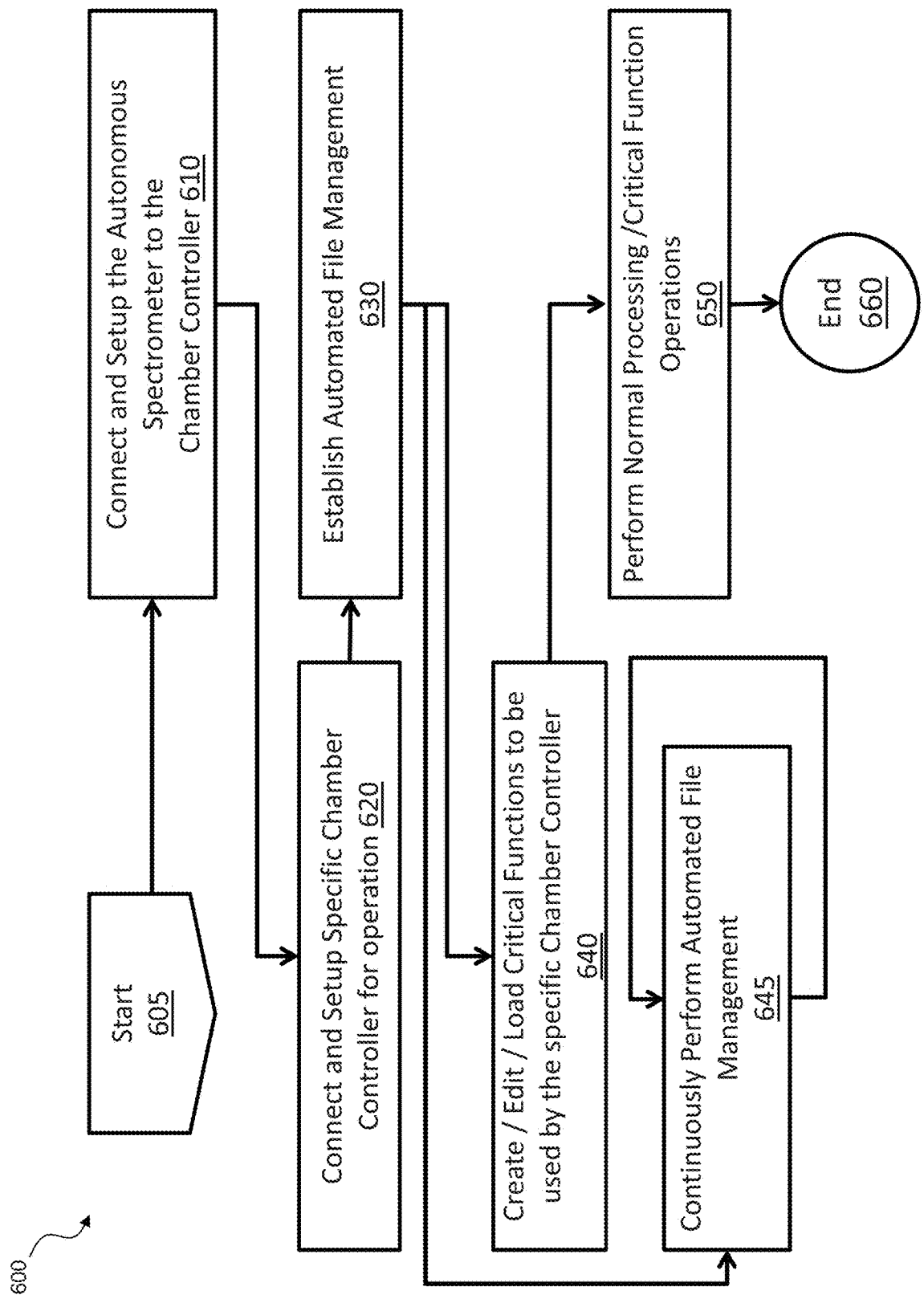
FIG. 6 illustrates a flow diagram of an embodiment of another method of operating a MPCS carried out according to the principles of the disclosure.

Turning now to FIG. 6, illustrated is an embodiment of a method 600 of operating a MPCS carried out according to the principles of the disclosure. For the method 600, the MPCS includes an autonomous spectrometer without tool or FAB networking options. The autonomous spectrometer 220 of FIG. 2, without tool or FAB network options, is an example. Unlike the method 500, in method 600 the operational controller essentially has a single CFCM instance. The method 600 begins in step 605.

In a step 610, the autonomous spectrometer is connected and setup with its corresponding chamber controller. The autonomous spectrometer can be connected to the chamber controller via a physical connection. An electrical connection for communicating and an optical connection can both be connected. Conventional ports, interfaces, etc., of the autonomous spectrometer and the chamber controller can be used for the physical connections. Setting-up the connection can include configuring the respective ports, interfaces, etc., for communicating over the connections. Unlike method 500, no connection between an operational controller and spectrometer is needed since this is inherent with an autonomous spectrometer.

The autonomous spectrometer is connected to and set-up with the chamber controller in a step 620. A URI of the autonomous spectrometer can be used to set-up the connection with the chamber controller and can include defining IP addresses, mapping to communication channels, and configuring the hardware of the communications interface to communicate with the specific chamber controller.

In a step 630, automated file management is established for the process control system. In one embodiment, this includes connecting a repository be connected to the autonomous spectrometer to receive data and log files. In some embodiments, the repository is already connected to the operational controller, such as via a cable, and the connection is confirmed. An AFM of the autonomous spectrometer can be used to set-up the connection with the repository and then activate the automated file management. The automated file management can automatically manage the data and log files independent of the operation of the critical functions. Unlike the method 500, NV storage of the autonomous spectrometer does not need to be configured to receive operational data such as data and log files since this is inherent to the autonomous spectrometer.

After step 630, the method 600 continues to step 540 and step 645 in parallel, just as in method 500. In step 630, critical function controls are provided for the specific chamber controller. The critical function controls can be loaded from the NV storage of the autonomous spectrometer. In some embodiments, the stored critical function controls are edited before being provided. An administrator can employ a user interface, such as screen and keyboard virtualization, to edit the critical function controls. In other embodiments, critical function controls or new critical function controls can be created. Again, a user interface can be employed to input or facilitate transfer of the critical function controls.

In step 645, automated file management is continually performed. The automated file management can include management of the NV storage and the repository. The automated file management can continue as long as the MPCS is operating.

Returning now to step 640, the method 600 continues to step 650 where monitoring of processes and critical function operations are performed. The monitoring of processes and the critical function operations can be performed as described above in step 550. The method 600 then continues to step 660 and ends.

Figure 7:
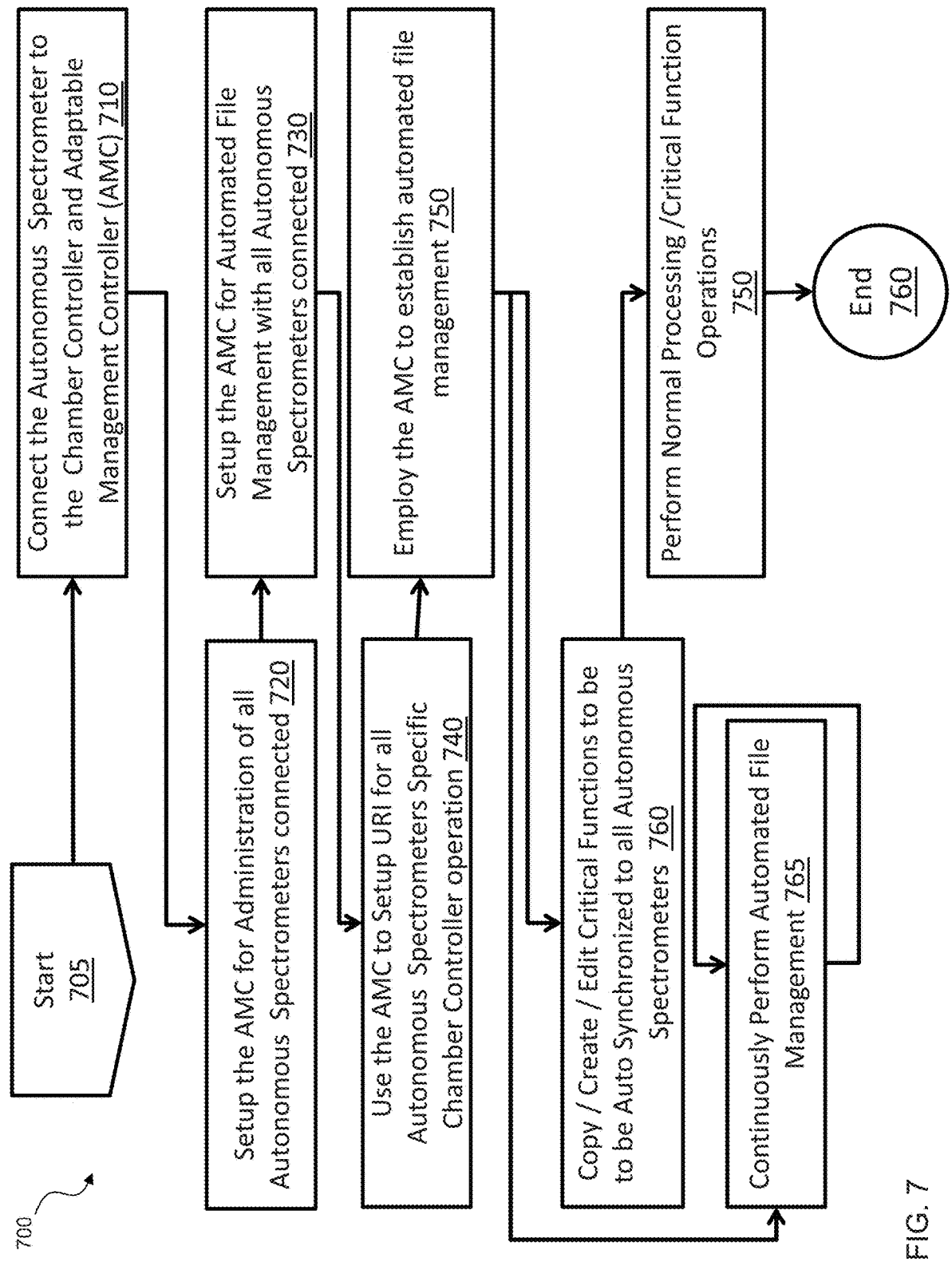
FIG. 7 illustrates a flow diagram of an embodiment of yet another method of operating a MPCS carried out according to the principles of the disclosure.

Turning now to FIG. 7, illustrated is an embodiment of a method 700 of operating a MPCS carried out according to the principles of the disclosure. For the method 700, the MPCS includes an autonomous spectrometer or spectrometers having tool or FAB networking options. Autonomous spectrometer 220 is an example. Multiple autonomous spectrometers can be employed with the method 700. The method 700 starts in a step 705.

In a step 710, the autonomous spectrometers are connected to their corresponding chamber controllers and an AMC. The autonomous spectrometers can be connected to the chamber controllers via a physical connection. An electrical connection for communicating and an optical connection can both be connected. Conventional ports, interfaces, etc., of the autonomous spectrometers and the chamber controllers can be used for the physical connections. Setting-up the connection can include configuring the respective ports, interfaces, etc., for communicating over the connections. The autonomous spectrometers can also be connected to the AMC via a physical connection, such as a cable. In this embodiment, multiple autonomous spectrometers are connected to the AMC and to each of their respective chamber controller but the method 700 also applies to a single autonomous spectrometer with network connections.

In a step 720, the AMC is set-up to administer all of the autonomous spectrometers connected thereto. In this step, an administrator can configure a process dashboard of the AMC to communicate with the autonomous spectrometer(s). Configuring the process dashboard can include defining IP addresses, mapping communication channels, and confirming the process dashboard has access to the autonomous spectrometer.

In a step 730, the AMC is set-up for automated file management. For the AMC, this includes setting-up the AMC for automated file synchronization with all of the autonomous spectrometers that are connected thereto. With the automated file management, updates can only occur when there is a connection. The updates can occur automatically. The files can be the critical function controls. A communication network can be used for the synchronization. After step 730, the autonomous spectrometers have all the files, and settings needed to perform critical functions.

The AMC is employed in a step 740 to set-up the URIs for each of the autonomous spectrometers to communicate with their specific chamber controllers. The process dashboard of the AMC can be used to communicate with the URI of each of the autonomous spectrometers to establish the connections. Setting-up can include defining IP addresses, mapping to communication channels, and configuring the hardware of communications interfaces to communicate with the specific chamber controllers. The corresponding chamber controller of each autonomous spectrometer is set-up with the CFCM instance on their autonomous spectrometer. After step 740, the autonomous spectrometers are aware of how the tool will communicate with them and are ready to receive commands to perform critical functions.

In a step 750, the AMC is employed to establish automated file management for the MPCS. The process dashboard of the AMC can be used for step 750. In one embodiment, establishing automated file management includes connecting each of the autonomous spectrometers to a repository. In some embodiments, the repository is already connected to the autonomous spectrometers, such as via a cable, and the connection is confirmed. An AFM of each of the autonomous spectrometers can be used to set-up the connections with the repository and activate the automated file management. The automated file management can automatically manage the data and log files independent of the operation of the critical functions. The AMC can also be used to set-up a central AFM of the process control system. In step 750, an administrator can use the AMC to set-up how data is to be managed by the MPCS. Advantageously, the AMC can be used for multiple steps of the method 700 allowing set-up of the MPCS from a single location.

After step 750, the method 700 continues to step 760 and step 765. In step 760, critical function controls are provided to all of the autonomous spectrometers. The AMC can be used to provide the critical function controls to all of the autonomous spectrometers. For example, a single file having critical function controls can be edited employing the AMC and then be provided as an updated file for each of the autonomous spectrometers through the network connections. In some embodiments, the stored critical function controls are edited before being provided. In step 760 an administrator may not have a user interface to the autonomous spectrometers, and instead use the elements of an AMC, such as an Editor/Analyzer, to edit the critical function controls. Likewise, the administrator can access the element(s) that are setup and connected via step 730 to place critical function controls such that the automated file management functions would ensure proper synchronization of critical function controls. In other embodiments, critical function controls or new critical function controls can be created. Again, a user interface can be employed to input the critical function controls.

In step 765, automated file management is continually performed. The automated file management can include management of the NV storage and the repository. The automated file management can continue as long as the MPCS is operating.

Returning now to step 760, the method 700 continues to step 770 where monitoring of processes and critical function operations are performed. The monitoring of processes and the critical function operations can be performed according to the method 550 described above. The method 700 then continues to step 760 and ends.

Figure 8:
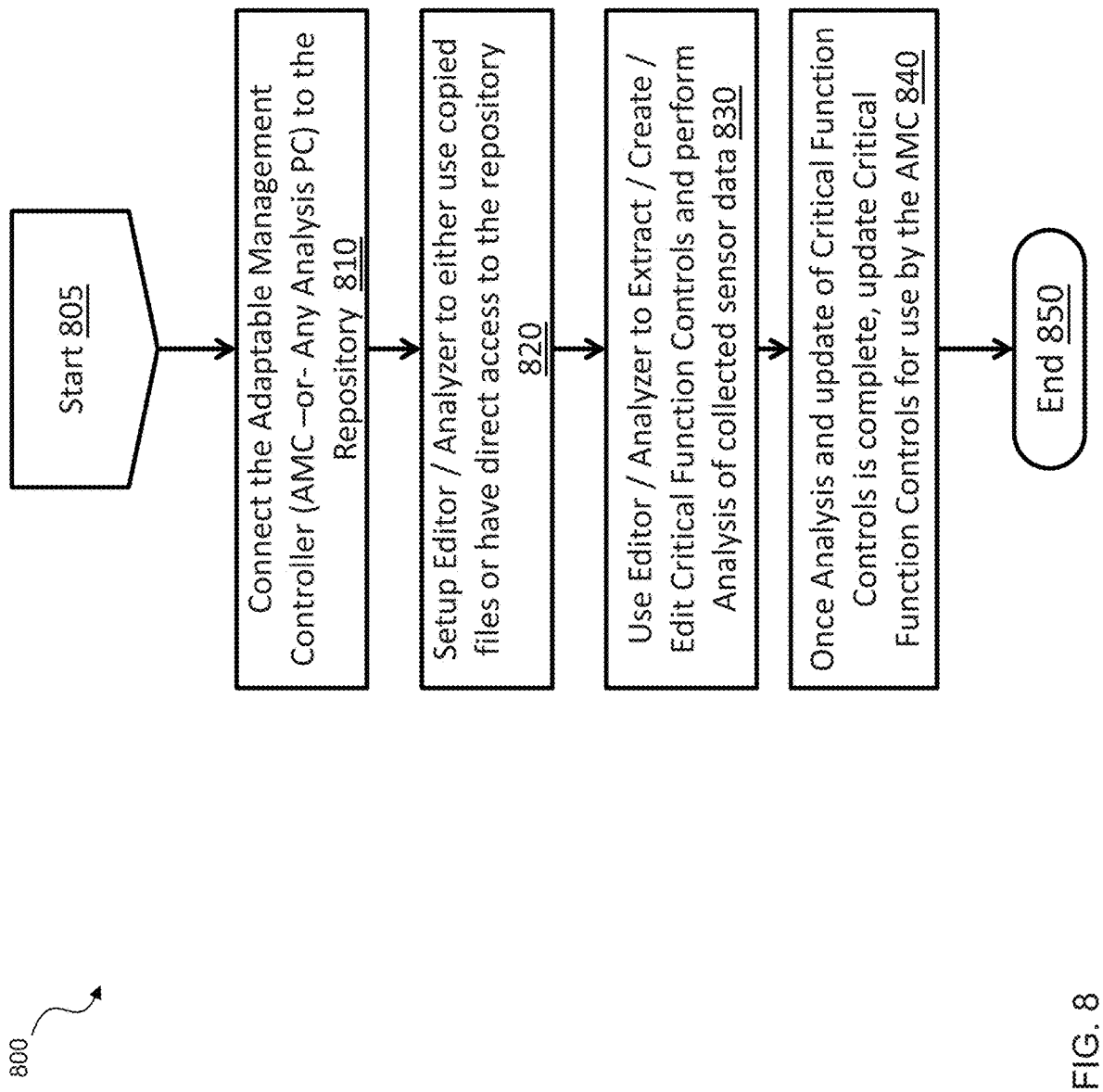
FIG. 8 illustrates a flow diagram of an embodiment of still another method of operating a MPCS carried out according to the principles of the disclosure.

Turning now to FIG. 8, illustrated is an embodiment of a method 800 of operating a MPCS carried out according to the principles of the disclosure. For the method 800, the MPCS includes an AMC having an editor/analyzer that is connected to a repository but is not connected to operational controllers. For example, the AMC 310 in FIG. 3 without employing the process dashboard 312 and the process visualizer 314, and the connections to the operational controller 320, but having the editor/analyzer 316 connected to the repository 330. In some embodiments, the repository can be connected to operational controllers such as illustrated in FIG. 3. The connection can be temporarily established, such as for communicating the data and log files and the critical function controls. The method 800 begins in a step 805.

In a step 810, an AMC is connected to the repository. The AMC can be connected via a wired connection. In some embodiments, the AMC can be implemented on a PC or laptop and connected to the repository via conventional connections.

After connecting, an editor/analyzer of the AMC is set-up in a step 820 to employ copied files or have direct access to the files on the repository. The copied files can be critical function controls loaded on the AMC.

In a step 830, critical function controls are provided to the repository and analysis of collected sensor data is performed. The critical function controls, such as obtained from the repository, can be edited via a user interface, such as a keyboard. In other embodiments, critical function controls or new critical function controls can be created. In this method, a user interface is required, and is typically in the form of a monitor, keyboard, mouse employed to function with the AMC to review, analyze, change critical function controls.

After analysis of the sensor data is complete and the critical function controls on the repository have been updated, the method 800 continues to step 840 where the critical function controls used by the AMC are updated. The method 800 then ends in a step 850.

The embodiments described herein were selected and described in order to best explain the principles of the disclosure and the practical application, and to enable others of ordinary skill in the art to understand the disclosure for various embodiments with various modifications as are suited to the particular use contemplated. The particular embodiments described herein are in no way intended to limit the scope of the present disclosure as it may be practiced in a variety of variations and environments without departing from the scope and intent of the disclosure. Thus, the present disclosure is not intended to be limited to the embodiment shown, but is to be accorded the widest scope consistent with the principles and features described herein.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

As will be appreciated by one of skill in the art, the disclosure or parts thereof may be embodied as a method, system, or computer program product. Accordingly, the features disclosed herein, or at least some of the features, may take the form of an entirely hardware embodiment, an entirely software embodiment (including firmware, resident software, micro-code, etc.) or an embodiment combining software and hardware aspects all generally referred to herein as a "circuit" or "module." Some of the disclosed features may be embodied in or performed by various processors, such as digital data processors or computers, wherein the computers are programmed or store executable programs of sequences of software instructions to perform one or more of the steps of the methods. Thus, features or at least some of the features disclosed herein may take the form of a computer program product on a non-transitory computer-usable storage medium having computer-usable program code embodied in the medium. The software instructions of such programs can represent algorithms and be encoded in machine-executable form on non-transitory digital data storage media.

Thus, portions of disclosed examples may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Those skilled in the art to which this application relates will appreciate that other and further additions, deletions, substitutions and modifications may be made to the described embodiments.

Various aspects of the disclosure can be claimed including the systems and methods as disclosed herein. Aspects disclosed herein include:

A. A process control system including: (1) an optical sensor configured to monitor a production process within a process chamber and generate optical data therefrom, (2) an operational controller configured to perform critical functions to determine processing conditions of the production process from the optical data, wherein the critical functions are directed by critical function controls, (3) an adaptable management controller configured to provide the critical function controls to the operational controller, wherein the adaptable management controller is hierarchically isolated from the operational controller during the critical functions.

B. A method of operating a process control system including: (1) providing, from an adaptable management controller, critical function controls for an operational controller, (2) autonomously performing, by the operational controller, critical functions employing the critical function controls, and (3) hierarchically isolating the adaptable management controller from the operational controller during the critical functions.

Each of the aspects A and B may have one or more of the following additional elements in combination:

Element 1: wherein the optical sensor is a spectrometer. Element 2: wherein the operational controller and the optical sensor are integrated in a single computing device. Element 3: wherein the single computing device is an autonomous spectrometer. Element 4: further comprising a repository, communicatively coupled to the operational controller and the adaptable management controller. Element 5: wherein the critical function controls include configuration files having variables, equations, and scripts. Element 6: wherein the operational controller is further configured to generate operational data from the critical functions and automatically send the operational data to the repository. Element 7: wherein the adaptable management controller is further configured to asynchronously access the operational data from the repository. Element 8: wherein the operational data includes data and log files. Element 9: further comprising multiple operational controllers configured to perform critical functions to determine processing conditions for different process chambers, wherein the adaptable management controller is coupled to each of the multiple operational controllers via a communications network and is configured to send critical function controls to each of the multiple operational controllers. Element 10: wherein the adaptable management controller is implemented on multiple computing devices. Element 11: further comprising automatically generating operational data associated with the critical functions. Element 12: further comprising asynchronously storing the operational data in a repository. Element 13: wherein the operational data includes data files and log files. Element 14: further comprising receiving optical data from an optical sensor monitoring a production process. Element 15: wherein autonomously performing the critical functions includes determining processing conditions of the production process from the optical data. Element 16: further comprising establishing automated file management for the process control system. Element 17: further comprising employing the adaptable management controller to store the critical function controls in a repository for access by the operational controller. Element 18: wherein the optical sensor is an autonomous spectrometer. Element 19: wherein the process control system includes multiple operational controllers and the critical function controls for each of the operational controllers are synchronized to each of the operational controllers from a single location. Element 20: further comprising editing critical function controls when the adaptable management controller is hierarchically isolated from the operational controller. Element 21: further comprising analyzing operational data when the adaptable management controller is hierarchically isolated from the operational controller.

What is claimed is:

1. A process control system, comprising:
    an optical sensor configured to monitor a production process within a process chamber and generate optical data therefrom;
    an operational controller configured to perform critical functions to determine processing conditions of the production process from the optical data, wherein the critical functions are directed by critical function controls;
    an adaptable management controller configured to provide the critical function controls to the operational controller, wherein the adaptable management controller is at least hierarchically isolated from the operational controller during the critical functions; and
    a repository, communicatively coupled to the operational controller and the adaptable management controller and configured to store operational data, wherein the operational controller is configured to generate the operational data from the critical functions and automatically send the operational data to the repository, and the adaptable management controller is configured to access the operational data from the repository, wherein communications connectivity between the operational controller and the adaptable management controller is based on an operating configuration of the process control system selected from different configurations that include a first configuration wherein the operational controller is a single operational controller with multiple processing chambers on a single tool, a second configuration having an autonomous spectrometer hierarchically isolated from the adaptable management controller, wherein the autonomous spectrometer includes the operational controller, a third configuration having an autonomous spectrometer connected to the adaptable management controller, wherein the autonomous spectrometer includes the operational controller, and a fourth configuration wherein the operational controller is not connected to the adaptable management controller and the adaptable management controller is connected to the repository.

2. The process control system as recited in claim 1 wherein the optical sensor is a spectrometer when the operating configuration is the first or fourth configuration.

3. The process control system as recited in claim 1 wherein the operational controller and the optical sensor are integrated in a single computing device when the operating configuration is the second or third configuration.

4. The process control system as recited in claim 3 wherein the single computing device is an autonomous spectrometer.

5. The process control system as recited in claim 1 wherein the critical function controls include specifications for processing the operational data.

6. The process control system as recited in claim 5 wherein the operational controller is communicatively coupled to the repository during the critical functions.

7. The process control system as recited in claim 5 wherein the critical function controls include configuration files having variables, equations, and scripts.

8. The process control system as recited in claim 1 wherein the adaptable management controller is communicatively coupled to the repository during the critical functions.

9. The process control system as recited in claim 1 wherein the operational data includes one or more of critical function results, system status, or log files.

10. The process control system as recited in claim 1, wherein when the operating configuration is the third configuration the process control system includes multiple operational controllers configured to perform critical functions to determine processing conditions for different process chambers, wherein the adaptable management controller is coupled to each of the multiple operational controllers via a communications network and is configured to send critical function controls to each of the multiple operational controllers.

11. The process control system as recited in claim 1 wherein the adaptable management controller is implemented on multiple computing devices.

12. A method of operating a process control system having an operational controller, an adaptable management controller, and a repository, comprising:
    determining an operating configuration of the process control system from different configurations, wherein the different configurations include a first configuration wherein the operational controller is a single operational controller with multiple processing chambers on a single tool, a second configuration having an autonomous spectrometer hierarchically isolated from the adaptable management controller, wherein the autonomous spectrometer includes the operational controller, a third configuration having an autonomous spectrometer connected to the adaptable management controller, wherein the autonomous spectrometer includes the operational controller, and a fourth configuration wherein the operational controller is not connected to the adaptable management controller and the adaptable management controller is connected to the repository; and
    operating the process control system according to the determined operating configuration, wherein for each of the first, second, third, and fourth configuration the operating includes:
    providing, from the adaptable management controller, critical function controls for the operational controller;
    autonomously performing, by the operational controller, critical functions employing the critical function controls; and
    sending, from the operational controller to the repository, operational data generated from the critical function, wherein during the critical functions, the adaptable management controller is at least hierarchically isolated from the operational controller.

13. The method as recited in claim 12, wherein the operating further includes automatically generating the operational data associated with the critical functions and asynchronously storing the operational data in the repository.

14. The method as recited in claim 13 wherein the operational data includes critical function results, data files and log files.

15. The method as recited in claim 12 wherein the adaptable management controller, the operational controller, and the repository are distinct from each other.

16. The method as recited in claim 12, wherein the operating includes receiving optical data from an optical sensor monitoring a production process.

17. The method as recited in claim 16 wherein autonomously performing the critical functions includes determining processing conditions of the production process from the optical data.

18. The method as recited in claim 16 wherein the optical sensor is an autonomous spectrometer when the operating configuration is the third or the fourth configuration.

19. The method as recited in claim 12 wherein the providing includes employing the adaptable management controller to send the critical function controls to the repository, and the method further includes accessing, by the operational controller, the critical function controls from the repository for the autonomously performing.

20. The method as recited in claim 12, wherein the operating further includes automatically managing data for the process control system by employing automated file managers in the operational controller and the adaptable management controller.

21. The method as recited in claim 12 wherein when the process control system is the third configuration, the process control system includes multiple operational controllers and the critical function controls for each of the operational controllers are synchronized to each of the operational controllers from the adaptable management controller.

22. The method as recited in claim 12, wherein the operating further includes editing critical function controls when the adaptable management controller is at least hierarchically isolated from the operational controller.

23. The method as recited in claim 12, wherein the operating further includes analyzing operational data when the adaptable management controller is at least hierarchically isolated from the operational controller.

* * * * *